(12) United States Patent
Walker et al.

(10) Patent No.: US 6,638,112 B1
(45) Date of Patent: Oct. 28, 2003

(54) MODULAR JACK HAVING SUBASSEMBLY OF PCBS AND MAGNETIC BOX

(75) Inventors: Kevin E. Walker, Hershey, PA (US); Iosif R. Korsunsky, Harrisburg, PA (US); James H. Hyland, Hummelstown, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/280,218

(22) Filed: Oct. 24, 2002

(51) Int. Cl.[7] ............................................. H01R 13/66
(52) U.S. Cl. ........................................ 439/620; 439/676
(58) Field of Search ................................ 439/620, 676, 439/607, 66, 74, 490, 344

(56) References Cited

U.S. PATENT DOCUMENTS 5,069,641 A  12/1991  Sakamoto et al.
6,238,247 B1 * 5/2001 Belopolsky et al. ........ 439/620
6,428,361 B1 * 8/2002 Imschweiler et al. ....... 439/676

* cited by examiner

Primary Examiner—Lynn Feild
Assistant Examiner—Son V. Nguyen
(74) Attorney, Agent, or Firm—Wei Te Chung (57) ABSTRACT

A modular jack (100) in accordance with the present invention includes an insulative housing (1) defining a cavity for receiving a plug connector, a conductive shield (2) substantially surrounding the insulative housing and a module assembly (10) installed in the cavity of the insulative housing. The module assembly includes a magnetic module (3), a first printed circuit board (PCB, 4), a second PCB (5), and a grounding plate (9). A contact array (6) is soldered to the first PCB. The first PCB is attached on a bottom wall (312) of the magnetic module. The second PCB carries capacitors and resistors and a pair of light emitting diodes (LEDs 501, 502) soldered on a front portion thereof. The second PCB is attached on a top wall (311) of the magnetic module. The magnetic module defines a passageway (38) and the grounding plate has a flat portion (90) received therein.

6 Claims, 8 Drawing Sheets

MODULAR JACK HAVING SUBASSEMBLY OF PCBS AND MAGNETIC BOX

CROSS-REFERENCE TO RELATED APPLICATION

The present application is related to commonly assigned and contemporaneously filed U.S. patent applications with unknown serial numbers, entitled "MODULAR JACK HAVING IMPROVED GROUNDING PLATE", and entitled "MODULAR JACK HAVING RETENTION MECHANISM", both invented by James H. Hyland et al.; Ser. No. 10/005,962, filed on Nov. 7, 2001, entitled "RJ MODULAR CONNECTOR HAVING GROUNDING MECHANISM", Ser. No. 10/040,754, filed on Dec. 28, 2001, entitled "ANTI CROSSTALK ELECTRICAL CONNECTOR AND METHOD OF MANUFACTURE THE SAME", Ser. No. 10/037,061, filed on Nov. 8, 2001, entitled "RJ MODULAR CONNECTOR HAVING SUBSTRATE HAVING CONDUCTIVE TRACE TO BALANCE ELECTRICAL COUPLINGS BETWEEN TERMINALS" and Ser. No. 10/037,706, filed on Dec. 29, 2001, entitled "RJ MODULAR CONNECTOR HAVING SUBSTRATE HAVING CONDUCTIVE TRACE TO BALANCE ELECTRICAL COUPLINGS BETWEEN TERMINALS", all invented by James H. Hyland. Copies of the specifications are hereto attached.

BACKGROUND OF THE INVENTION

1. Field of the Invention

The present invention relates to a modular jack, and more particularly to a modular jack having a terminal insert configured by first and second printed circuit board with a noise suppressing module arranged therebetween.

2. Description of Prior Art

As the integration of modular jacks and magnetics has become commonplace, so too it has become a common practice to employ an internal printed circuit board (PCB) as the means to facilitate a merger. U.S. Pat. No. 5,069,641, issued to Sakamoto on Dec. 3, 1991, discloses a modular jack assembly in which a choke coil and terminals are soldered to a PCB. This PCB subassembly is then encased in an insulative housing. The insulative housing comprises a base, a lid and two internal chambers. The PCB subassembly is mounted in one chamber which is separated by a separator from the other chamber adapted to receive a plug connector. The lid is attached to encase the PCB subassembly. Although the integration of an internal PCB and a choke coil and the merge of an internal PCB and a choke coil become common, the challenge of the merger is still great. Crowding, coupling of undesirable combinations of signals, hi-pot failure potential, etc., are a few of the challenge to be overcome. Therefore, sometimes using two or more internal PCBs can offset their additional cost by actually simplifying assembly in some cases, and increasing the levels of performance in most cases.

Hence, an improved modular jack is required to overcome the disadvantages of the conventional modular jack.

BRIEF SUMMARY OF THE INVENTION

A main object of the present invention is to provide a modular jack having a first printed circuit board (PCB) and a second PCB attached on a magnetic module.

A modular jack in accordance with the present invention comprises an insulative housing defining a cavity for receiving a plug connector, a conductive shield substantially surrounding the insulative housing and a module assembly received in the cavity of the insulative housing. The module assembly comprises a magnetic module, a first printed circuit board (PCB), a second PCB and a grounding plate. A contact array is soldered to the first PCB. The first PCB is attached on a bottom wall of the magnetic module. The second PCB carries capacitors and resistors and a pair of light emitting diodes (LEDs) soldered on a front portion thereof. The second PCB is disposed off from a top wall of the magnetic module. The magnetic module defines a passage and the grounding plate has a flat portion received therein.

Other objects, advantages and novel features of the invention will become more apparent from the following detailed description of the present embodiment when taken in conjunction with the accompanying drawings.

DETAILED DESCRIPTION OF THE INVENTION

Figure 1:
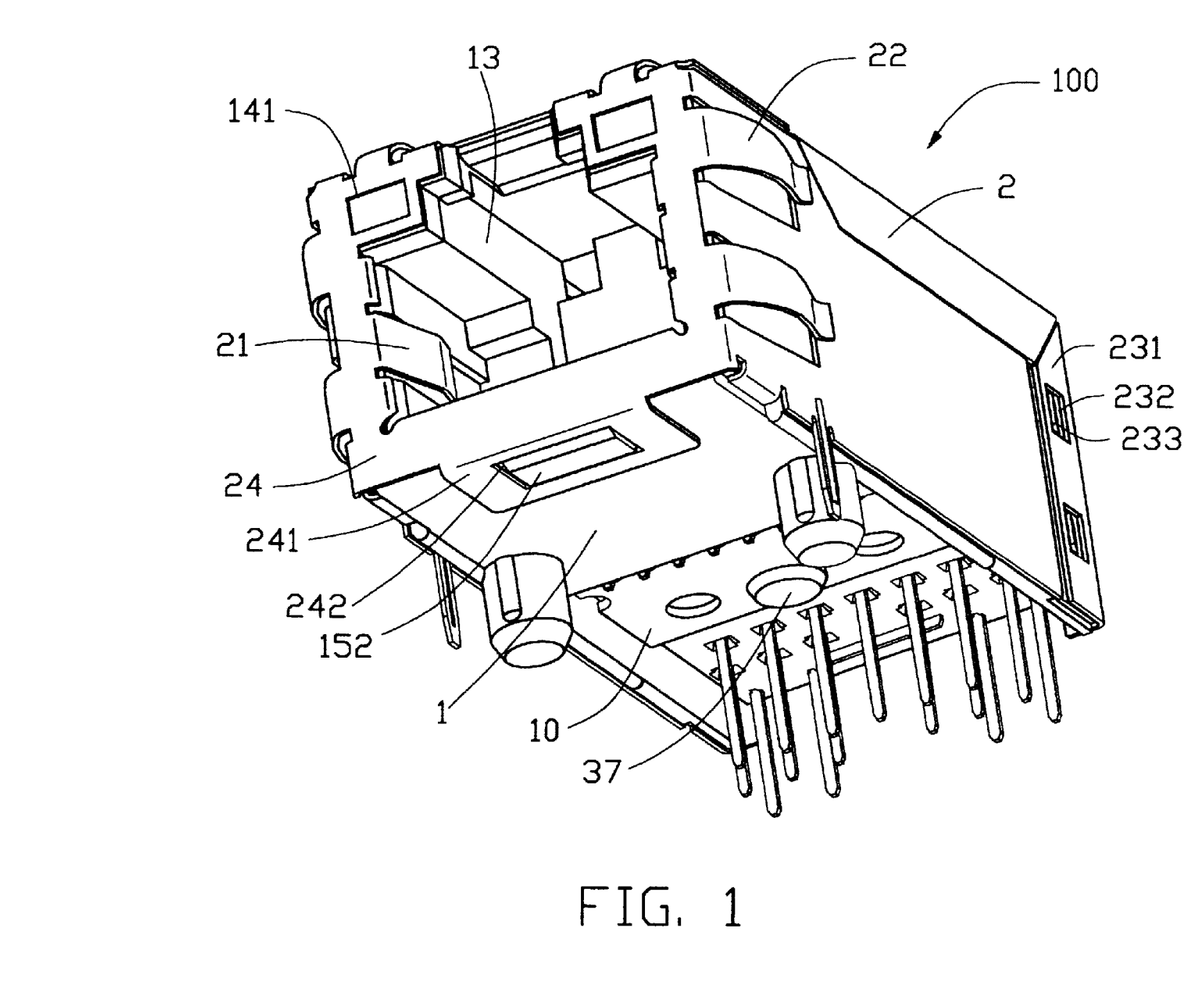
FIG. 1 is a perspective view of a modular jack in accordance with the present invention.

Referring to FIG. 1, a modular jack 100 for being mounted on a main printed circuit board (PCB, not shown) in accordance with the present invention comprises an insulative housing 1, a conductive shield 2 substantially surrounding the insulative housing 1 and a module assembly 10 installed in the insulative housing 1.

Figure 2:
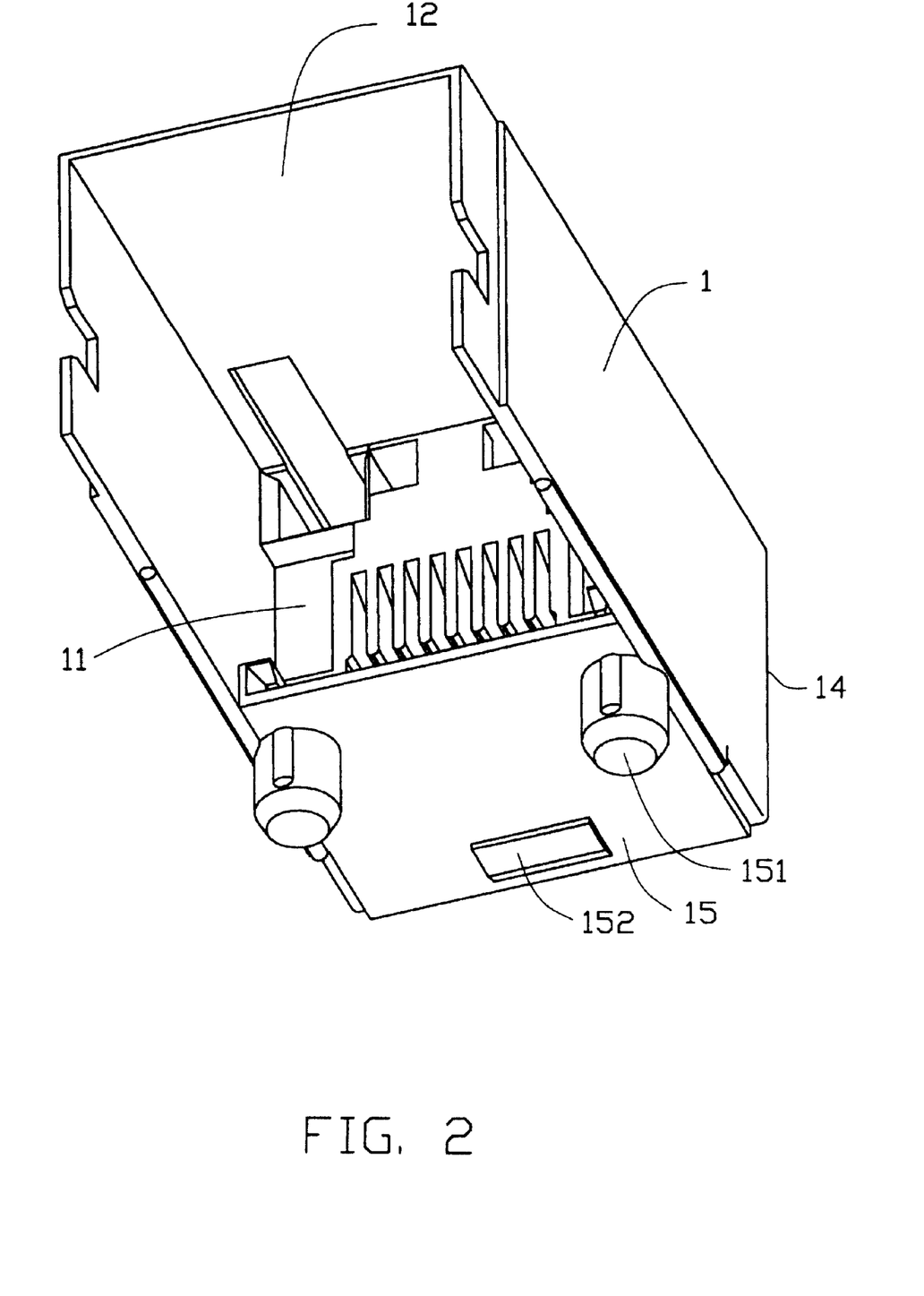
FIG. 2 is a perspective view of an insulative housing of the modular jack shown in FIG. 1.

Referring to FIGS. 1 and 2, the insulative housing 1 has a separator 11 which divides an interior space of the insulative housing 1 into a front chamber 13 and a rear chamber 12. The front chamber 13 receives a complementary plug (not shown). The rear chamber 12 receives the module assembly 10. The housing 1 has a front wall 14 and a bottom wall 15. The front wall 14 defines a pair of light emitting diode (LED) receiving cavities 141 extending therethrough. The bottom wall 15 has two locating posts 151 formed thereon, and a wedge 152 formed on front portion thereof.

The shield 2 has a plurality of flexible fingers 21 which are bent into the front chamber 13 for engaging with an outer shield of the complementary plug. The shield 2 also has a plurality of outwardly bent flexible fingers 22 for engaging with an appropriate support structure (not shown) within which the modular jack 100 may be mounted. The shield 2 has a pair of side walls (not labeled), a front shield wall 24 and a rear shield wall (not labeled). Each side wall forms a pair of wedges 233 on a rear portion thereof and the rear shield wall has a pair of flaps 231 each defining a pair of slots 232 engaging with corresponding wedges 233 of the side walls of the shield 2. The front shield wall 24 has a bottom flap 241 defining a slot 242 engaging with the wedge 152 of the housing 1 to secure the shield 2 to the housing 1.

Figure 3:
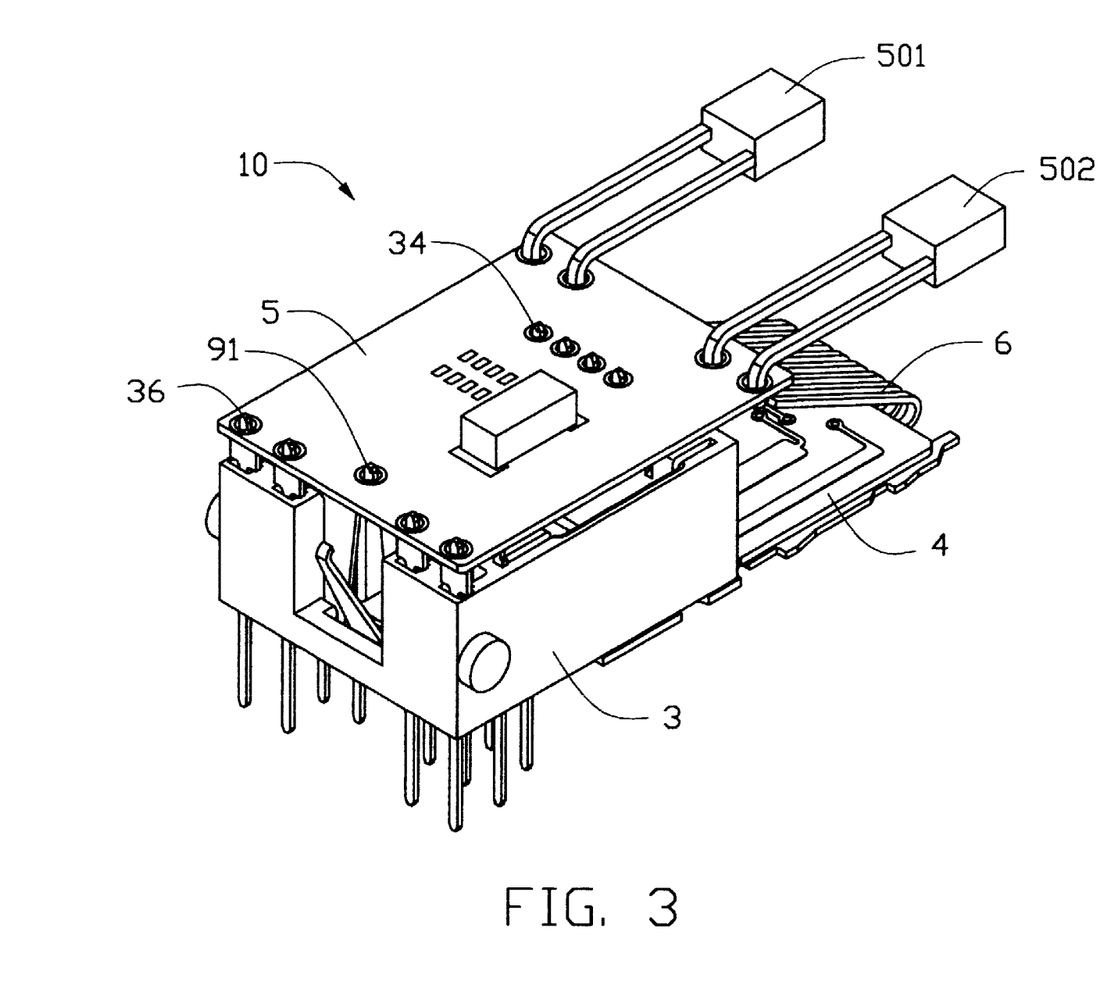
FIG. 3 is a perspective view of a module assembly of the modular jack shown in FIG. 1.
Figure 4:
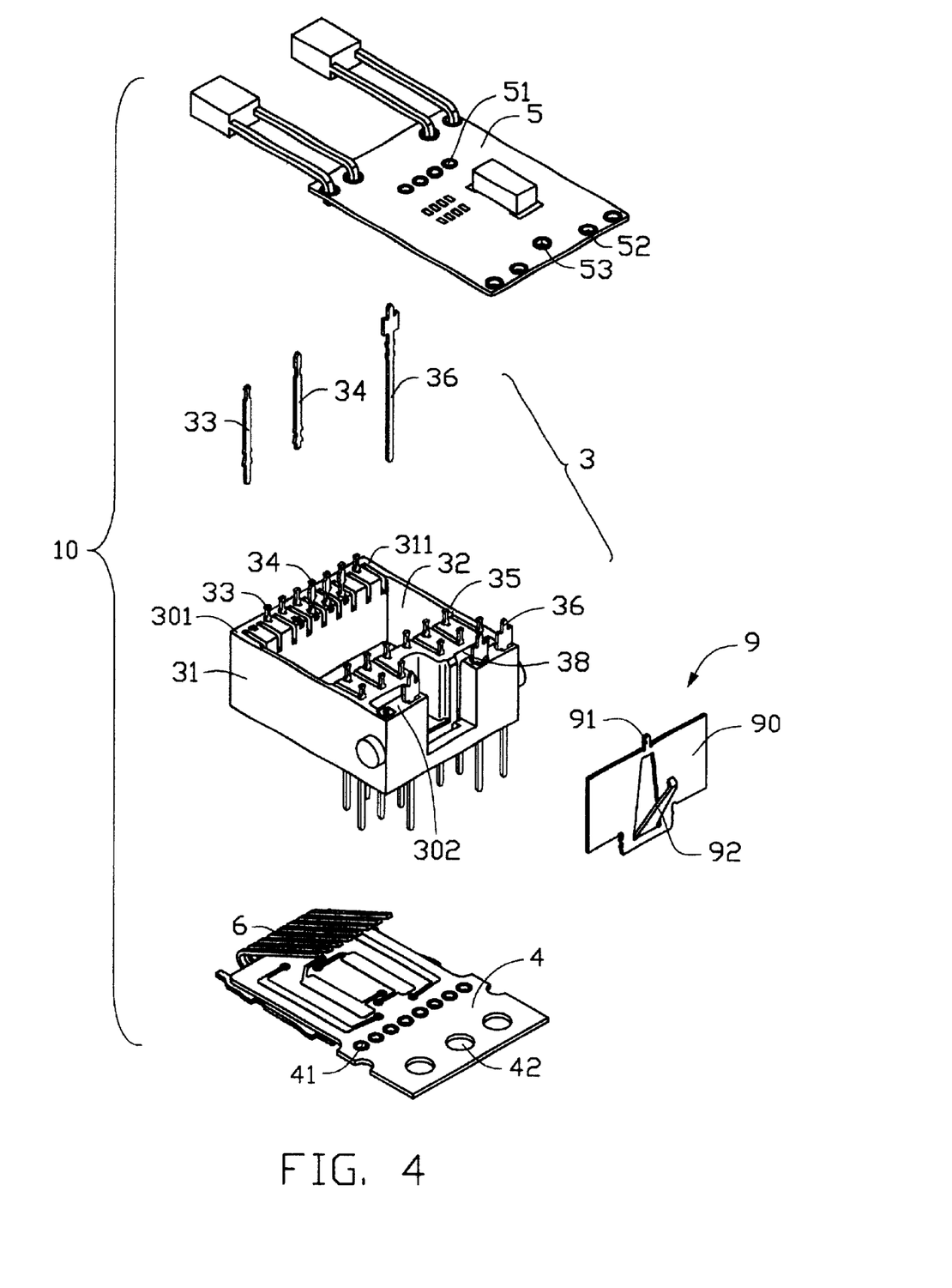
FIG. 4 is an exploded view of FIG. 3.
Figure 5:
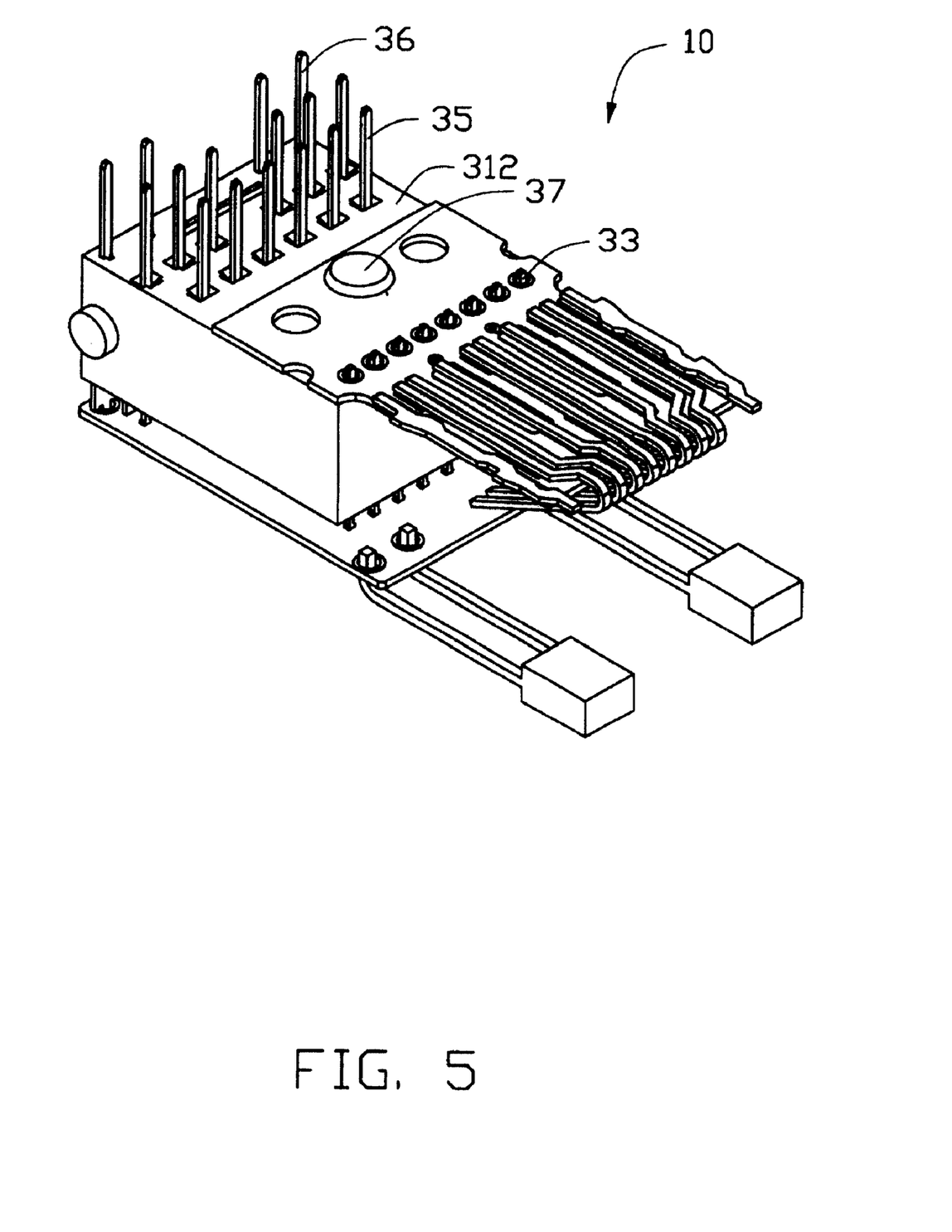
FIG. 5 is another perspective view of FIG. 3 taken from a bottom aspect.

Referring to FIGS. 3, 4 and 5, The module assembly 10 comprises a magnetic module 3, a first PCB 4, a second PCB 5, a contact array 6, a pair of LEDs 501, 502 and a grounding plate 9. The contact array 6 is soldered to the first PCB 4. The first PCB 4 has a plurality of first soldering holes 41 and a holding hole 42 defined in a rear portion of the first PCB 4.

The second PCB 5 carries capacitors (not labeled), resistors (not labeled) and the LEDs 501, 502 soldered thereon. The second PCB 5 also has a plurality of second soldering holes 51 adjacent to the LEDs 501, 502. A plurality of third soldering holes 52 are defined in a rear portion of the second PCB 5. A grounding hole 53 is defined between second soldering holes 51 and third soldering holes 52.

The magnetic module 3 has an insulative base 31. The base 31 has a top wall 311 and a bottom wall 312. A cavity 32 for housing magnetic coils (not shown) is defined in the base 31 and opens in the top wall 311. The cavity 32 divides the top wall 311 into a front side 301 and a rear side 302. A plurality of first pins 33 are fixed in the front side 301 and extend through top and bottom walls 311, 312 of the base 31. A plurality of second pins 34 which are longer than the first pins 33 are fixed adjacent to the first pins 33. A plurality of first terminals 35 and second terminals 36 which are longer than the first terminals 35 extend through the rear side 302 of the base 31. A passageway 38 for receiving the grounding plate 9 is defined in the rear side 302. A post 37 is formed on a middle portion of the bottom wall 312.

The grounding plate 9 has a flat portion 90 and a soldering portion 91 formed on a top edge of the flat portion 90. The soldering portion 91 is to be positioned in the grounding hole 53 of the second PCB 5 before the second PCB is soldered to the pins 33, 34 of the magnetic module 3. A connection beam 92 is bent rearwardly from the flat portion 90 and contacts the rear shield wall of the shield 2.

In assembly, The first PCB 4 is attached on the bottom wall 312 of the magnetic module 3 by soldering the plurality of first pins 33 to the first soldering holes 41 and inserting the post 37 into the holding holes 42. The contact array 6 is soldered on the first PCB 4. The first PCB 4 cantilevers forward from the base 31. The second PCB 5 is disposed off from the top wall 311 of the magnetic module 3 by inserting pins 34, terminals 36 and soldering portion 91 of the grounding plate 9 into respective holes 51, 52 and 53. The module assembly 10 is installed into the housing 1 so that the magnetic module 3, the first PCB 4 and the second PCB 5 are received in the rear chamber 12. The two LEDs 501, 502 and the contact array 6 extend into the front chamber 13 through separator 11. The two LEDs 501, 502 are inserted into corresponding LED receiving cavities 141. The contact array 6 electrically contacts terminals of the complementary plug, and the terminals 35, 36 fix the modular jack 100 on the main PCB and electrically connect proper circuit traces on the main PCB.

Figure 6:
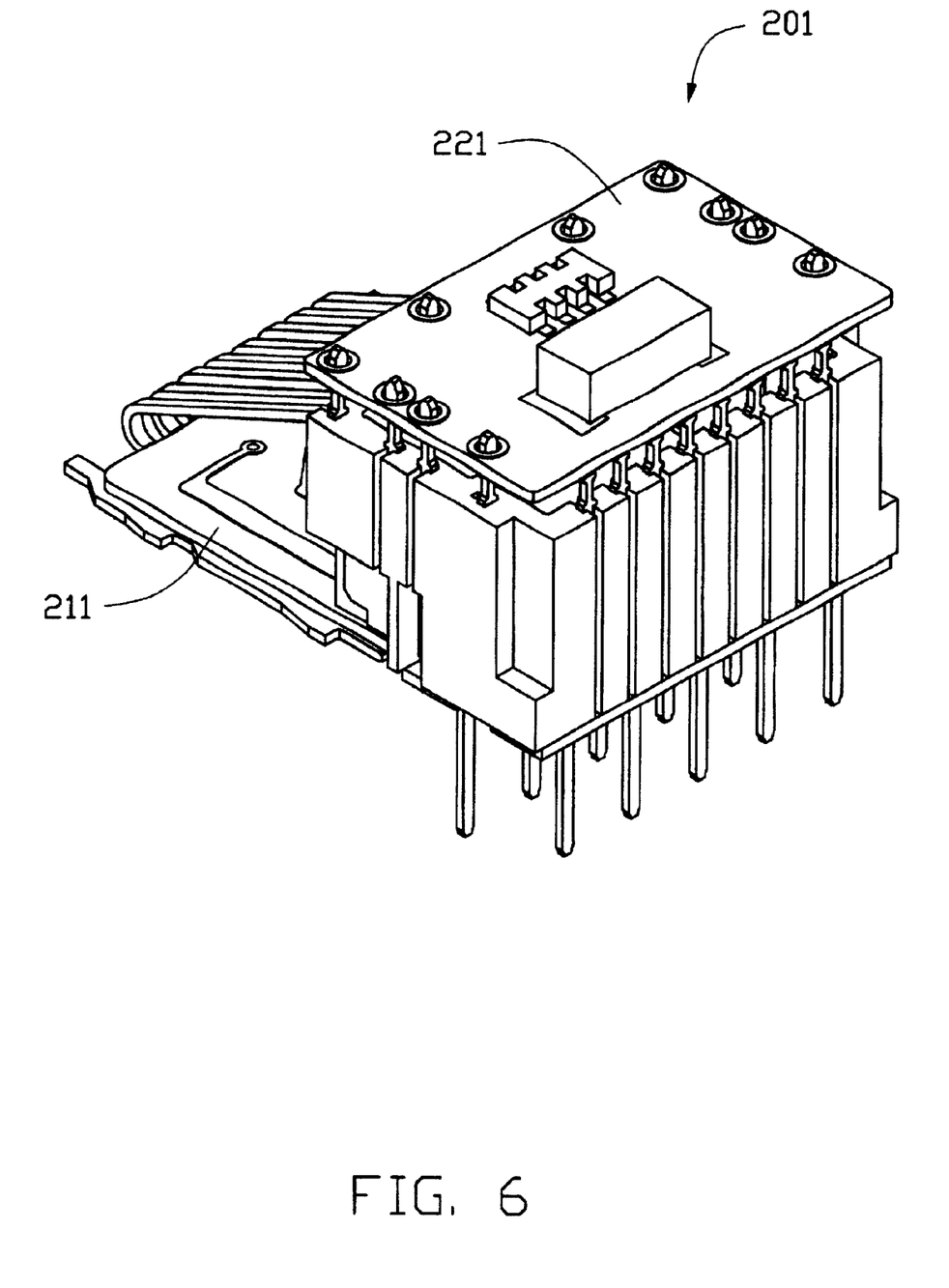
FIG. 6 is a perspective view of a module assembly of a second embodiment in accordance with the present invention.
Figure 7:
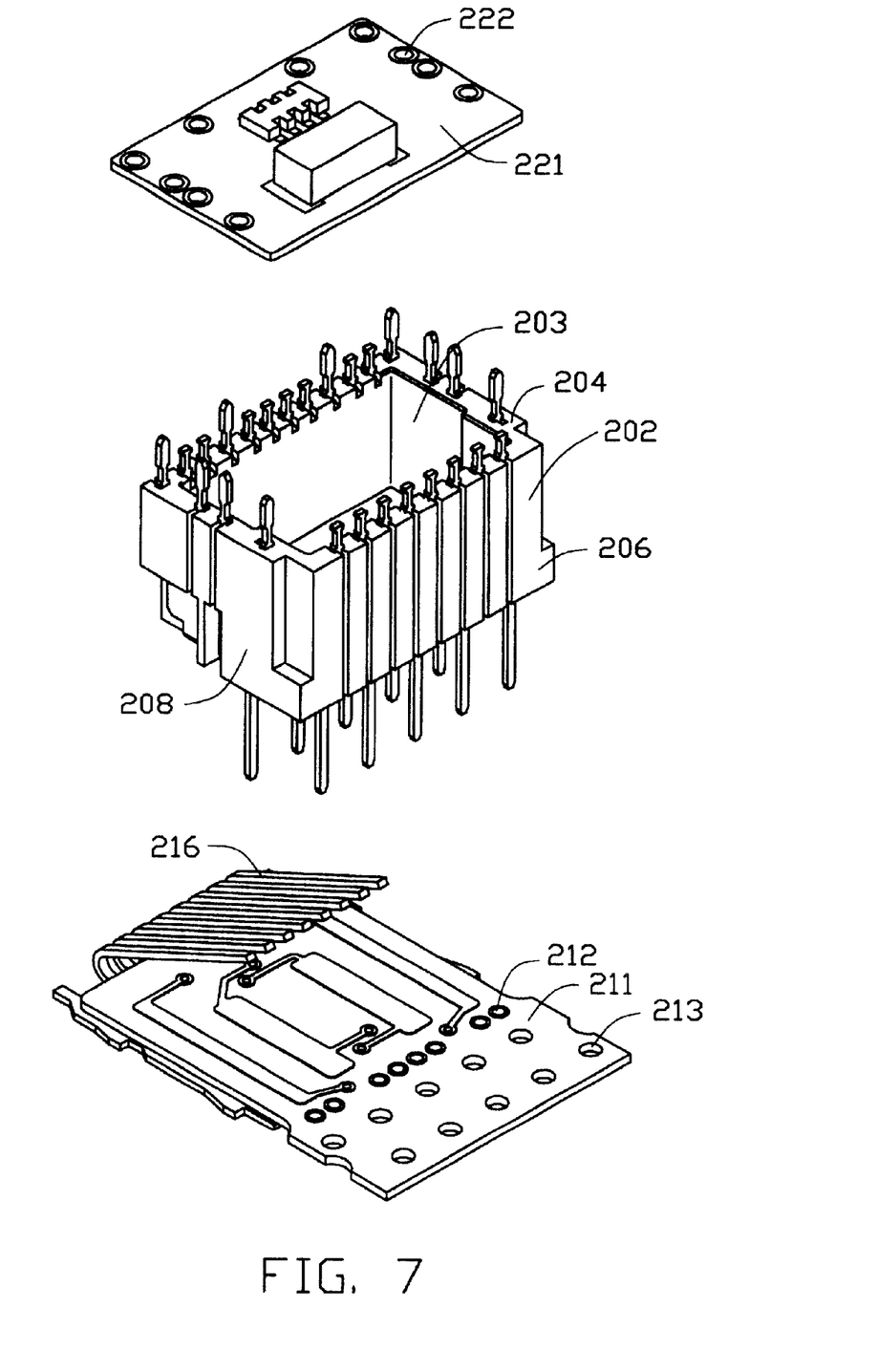
FIG. 7 is an exploded view of the module assembly shown in FIG. 6.
Figure 8:
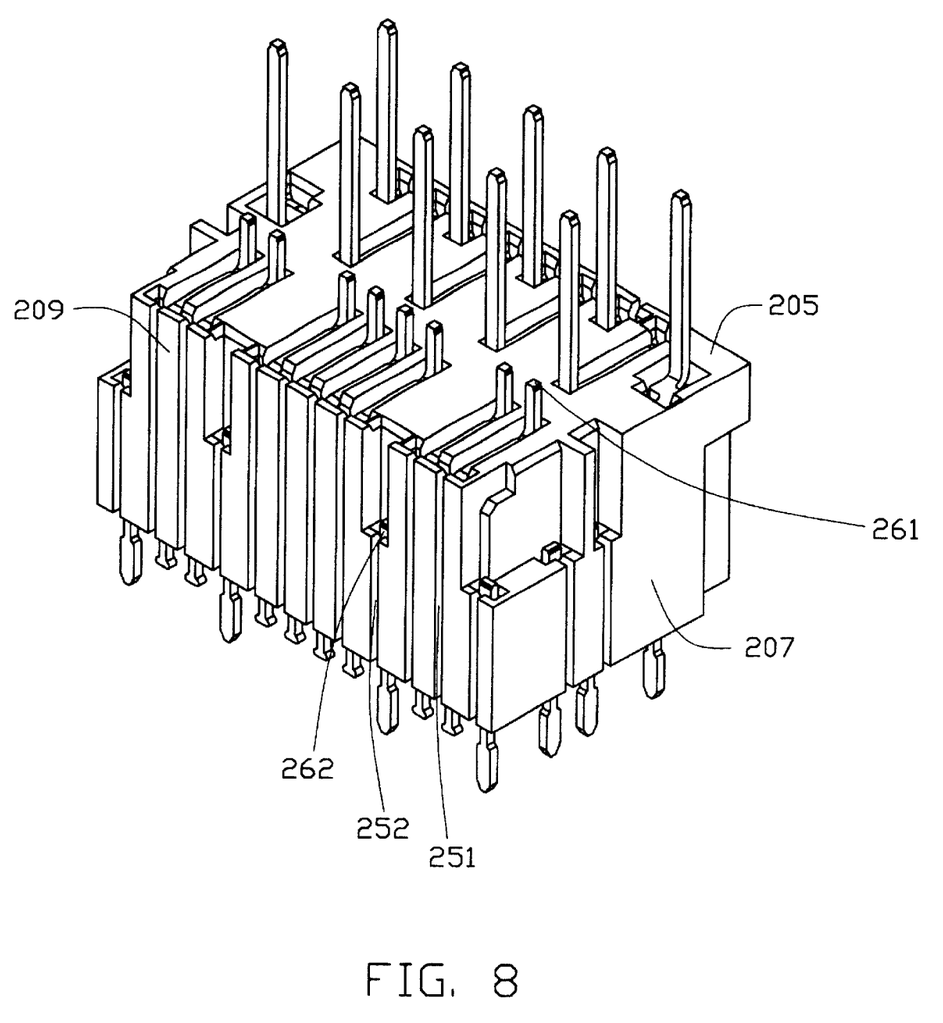
FIG. 8 is a perspective view of a magnetic module shown in FIG. 7.

FIGS. 6, 7 and 8 show a module assembly 201 employed in a second embodiment. The module assembly 201 comprises a magnetic module 202, a first PCB 211 and a second PCB 221.

The magnetic module 202 has a cavity 203 defined therein for housing magnetic coils (not shown). The magnetic module 202 has a top wall 204, a bottom wall 205, a first side wall 206, a second side wall 207, a third side wall 208 and a fourth side wall 209. A plurality of straight slots 252 and bending slots 251 are defined in the four side walls 206, 207, 208 and 209. A plurality of straight terminals 262 and bending terminals 261 are inserted into corresponding slots and extending through the slots.

The first PCB 211 is attached on the bottom wall 205 off from the magnetic module 202. The first PCB 211 has a contact array 216 soldered thereon, a plurality of first soldering holes 212 and a plurality of holes 213.

The second PCB 221 is attached on the top wall 204 off from the magnetic module 202. The second PCB 221 has capacitors (not labeled) and resistors (not labeled) attached thereon and with a plurality of second soldering holes 222 defined therein. Higher protruding terminals (not labeled) from the top wall 204 are inserted into second soldering holes 222. Higher protruding terminals (not labeled) from the bottom wall 205 are inserted into holes 213. Lower protruding terminals (not labeled) from the bottom wall 205 are inserted into first soldering holes 212.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A modular jack comprising:

a housing defining a cavity for receiving a plug connector;

a terminal insert received in the cavity, the terminal insert having a noise suppressing module, a first PCB positioned on one side of the noise suppressing module, a second PCB positioned on an opposite of the noise suppressing module;

a pair of LEDs soldered on the second PCB and extend forwardly therefrom to a front portion of the cavity of the housing; and a contact array mounted on the first PCB with mating portions extending above the first PCB and into the cavity; wherein the noise suppressing module is a magnetic module which has a top wall, a bottom wall, a first side wall, a second side wall, a third side wall and a fourth side wall; wherein an opening is defined in the magnetic module; wherein the magnetic module has a plurality of straight slots and bending slots defined in the four side walls; wherein the magnetic module has a plurality of straight terminals and bending terminals inserted into corresponding slots.

2. The modular jack as described in claim 1, wherein said modular jack further comprises a shield substantially surrounding the housing.

3. The modular jack as described in claim 1, wherein the housing defines a front chamber and a rear chamber, and the noise suppressing module attached with the first PCB and the second PCB, is installed in the rear chamber.

4. The modular jack as described in claim 1, wherein the magnetic module has a grounding plate attached thereon.

5. The modular jack as described in claim 1, wherein the second PCB has capacitors and resistors carrying thereon and the pair of LEDs soldered on a front portion thereof.

6. A modular jack comprising:

a housing defining a cavity for receiving a plug connector;

a terminal insert received in the housing, and including:
- a noise suppressing module having a plurality of terminals and retainably sandwiched between and mechanically and electrically connected to opposite upper and lower printed circuit boards, and
- a contact array mounted on the lower printed circuit board with mating portions extending above the lower printed circuit board and into the cavity; wherein the lower printed circuit board is used for compensation among signal pairs of said contact array; wherein the upper printed circuit board is equipped with resistors, capacitors and a pair of LEDs soldered on a front portion thereof.

\* \* \* \* \*